(12) United States Patent
Fink et al.

(10) Patent No.: US 9,647,247 B2
(45) Date of Patent: May 9, 2017

(54) ENCASEMENT FOR A BATTERY CELL AND FOR A BATTERY SYSTEM, PROCESS FOR PRODUCING SAID ENCASEMENT, BATTERY CELL AND BATTERY SYSTEM

(71) Applicant: Robert Bosch GmbH, Stuttgart (DE)

(72) Inventors: Holger Fink, Stuttgart (DE); Joachim Fetzer, Bad-Ditzenbach (DE); Thomas Wöhrle, München (DE); Sarmimala Hore, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/800,009

(22) Filed: Jul. 15, 2015

(65) Prior Publication Data

US 2016/0020439 A1 Jan. 21, 2016

(30) Foreign Application Priority Data

Jul. 15, 2014 (DE) .................. 10 2014 213 676

(51) Int. Cl.
*H01M 2/02* (2006.01)
*H05K 9/00* (2006.01)
*H01M 2/10* (2006.01)

(52) U.S. Cl.
CPC ....... *H01M 2/0287* (2013.01); *H01M 2/0202* (2013.01); *H01M 2/024* (2013.01); *H01M 2/026* (2013.01); *H01M 2/0217* (2013.01); *H01M 2/0262* (2013.01); *H01M 2/0277* (2013.01); *H01M 2/0285* (2013.01); *H01M 2/1061* (2013.01); *H01M 2/1077* (2013.01); *H01M 2/1094* (2013.01); *H05K 9/0049* (2013.01); *H01M 2220/10* (2013.01); *H01M 2220/20* (2013.01); *H01M 2220/30* (2013.01)

(58) Field of Classification Search
CPC ............. H01M 2/0202; H01M 2/1094; H01M 2220/20; H01M 2220/10; H01M 2/0262; H01M 2/026; H01M 2/024; H05K 9/0049
See application file for complete search history.

(56) References Cited

U.S. PATENT DOCUMENTS

| | | |
|---|---|---|
| 2005/0276978 A1 | 12/2005 | Chen |
| 2009/0277680 A1 | 11/2009 | Lee |
| 2013/0341835 A1* | 12/2013 | Bhatt ................... B82Y 30/00 264/328.18 |

FOREIGN PATENT DOCUMENTS

| | | |
|---|---|---|
| EP | 2072309 | 6/2009 |
| EP | 2465719 | 6/2012 |
| WO | 2012028689 | 3/2012 |

* cited by examiner

*Primary Examiner* — Mark F Huff
*Assistant Examiner* — Monique Wills
(74) *Attorney, Agent, or Firm* — Michael Best & Friedrich LLP

(57) ABSTRACT

An encasement (20) for a battery cell (2) and for a battery system (1) wherein said encasement is in the form of a sheet and comprises a core layer (22). This core layer (22) comprises carbon nanotubes. The invention further relates to a process for producing an encasement (20) which comprises initially coating a polymer substrate with an oxide material and applying carbon nanotubes to an oxide layer thus formed.

14 Claims, 2 Drawing Sheets

ENCASEMENT FOR A BATTERY CELL AND FOR A BATTERY SYSTEM, PROCESS FOR PRODUCING SAID ENCASEMENT, BATTERY CELL AND BATTERY SYSTEM

BACKGROUND OF THE INVENTION

The present invention relates to an encasement for shielding electromagnetic radiation for a battery cell and for a battery system and to a process for producing said encasement. The invention further relates to a battery cell and to a battery system.

It is apparent that, in the future, new battery systems having very high demands placed on them in terms of reliability, safety, performance and lifetime will be employed not only in stationary applications, such as wind power plants, and in hybrid or electric motor vehicles but also in electronic equipment, such as laptops or mobile telephones.

So-called lithium-ion battery cells in particular are used here. Said cells are notable for, inter alia, high energy densities, thermal stability and very low self-discharging. Lithium-ion battery cells comprise a positive electrode and a negative electrode at which lithium ions can be reversibly inserted and deinserted during charging and discharging. This is also known as intercalation and deintercalation.

A battery cell generally comprises one or more electrode units in the form of a roll. An electrode unit comprises two collector foils which, with a separator placed between them, are wound into a battery roll. The collector foils of the electrode units are electrically connected in known fashion to the poles of the battery cell which are also known as terminals.

A battery cell further comprises a metallic housing, made of aluminum for example. The housing is generally prismatic or cuboid shaped and pressure-resistant. Once the electrode units have been connected to the terminals the housing is filled with an electrolyte solution.

Lithium-ion battery cells are relatively sensitive to environmental influences, particularly to air and moisture. The abovementioned housing offers protection against said environmental influences.

A plurality of such battery cells may be combined to form a battery system also known as a battery pack.

Battery cells need to meet electromagnetic compatibility requirements. This means that the battery cell must not be affected by external electromagnetic fields and the battery cell itself must not emit electromagnetic fields that cause other equipment in the vicinity to be affected.

EP 1 403 942 A1 discloses lithium-ion battery cells of a battery system which are provided with an encasement made of polypropylene, polyethylene terephthalate, polycarbonate or a composite material formed therefrom. To shield electromagnetic radiation the encasement is provided with a coating comprising nickel powder or carbonyl iron powder dispersed in high density in acrylic prepolymer.

EP 2 072 309 A1 discloses a battery unit for use in an electric vehicle. To shield electromagnetic radiation the vehicle is provided with a frame structure with metal members which peripherally surround the battery unit. For shielding purposes the vehicle may further be provided with an insert member comprising metal embedded in a plastics resin.

EP 2 465 719 A1 discloses a battery housing for receiving a plurality of battery modules for operating an electric vehicle. The battery housing comprises tray members comprising metal sheets for shielding electromagnetic radiation.

SUMMARY OF THE INVENTION

An encasement according to the invention for a battery cell and for a battery system is in the form of a sheet and comprises a core layer comprising carbon nanotubes.

The encasement according to the invention is accordingly relatively thin and thus space-saving and reliably shields electromagnetic radiation. The encasement according to the invention is further relatively robust and thus provides additional protection for the surface of the battery cell/the battery system.

In accordance with an advantageous embodiment of the invention the core layer comprises an oxide material. The oxide material may be used to produce an adherent oxide layer to which the carbon nanotubes adhere relatively firmly. The oxide material and the carbon nanotubes are preferably provided in a ratio of from 1:1 to 5:1, more preferably in a ratio of 3:1.

The core layer preferably comprises a polymer substrate. The core layer and hence the encasement is therefore electrically nonconducting and thus provides electrical insulation for the battery cell/the battery system.

An advantageous development of the invention provides at least one covering layer applied to the core layer. The covering layer protects the core layer from environmental influences and from mechanical damage.

It is particularly advantageous when the encasement has a sandwich structure comprising two covering layers which enclose the core layer between them. The central core layer is thus protected on both sides, i.e. on the side facing the battery cell or the battery unit and likewise on the side facing outward, by one covering layer in each case.

It is preferable when the at least one covering layer/both covering layers are polymer sheets. The polymer sheet provides reliable protection for the core layer at a relatively low thickness and is electrically nonconducting.

A process according is provided for producing an encasement according to the invention. The process comprises generating an oxide layer by coating a polymer substrate with an oxide material and applying carbon nanotubes to the oxide layer thus formed. This forms a core layer of an encasement according to the invention.

The process preferably comprises heating the oxide material-coated polymer substrate before application of the carbon nanotubes. This forms a relatively firmly adherent oxide layer to which the subsequently applied carbon nanotubes firmly adhere.

It has now been found that heating the oxide material-coated polymer substrate to a temperature of from 100° C. to 200° C., preferably from 140° C. to 160° C., particularly preferably to 150° C., forms a particularly firmly adherent oxide layer.

Heating of the oxide material-coated polymer substrate is preferably carried out in a vacuum chamber. The vacuum chamber permits heating of the polymer substrate to temperatures of from 100° C. to 200° C.

The process advantageously comprises dispersing the carbon nanotubes in a solution before application to the oxide layer. The solution comprising the carbon nanotubes is subsequently applied to the oxide layer. Dispersal makes it possible to apply said carbon nanotubes to the oxide layer in simple fashion, for example by spray application or by immersion of the oxide layer in the solution. The solution in which the carbon nanotubes are dispersed is preferably an organic solution. Said solution is, in particular, an alcohol solution. To aid dispersal it is possible to add alkali metals, for example sodium or potassium, to the solution, in particular the organic solution, in particular the alcohol solution.

It is preferable to subsequently apply, to at least one side of the core layer formed, a covering layer which is in particular a polymer sheet.

It is preferable to apply to the opposite side of the core layer a further covering layer which is likewise in particular a polymer sheet.

The present disclosure further proposes a battery cell and comprising at least one encasement according to the invention, and also a battery system and comprising at least two battery cells and at least one encasement according to the invention.

BRIEF DESCRIPTION OF THE DRAWINGS

Illustrative embodiments of the invention are more particularly elucidated with reference to the drawings and to the description which follows.

DETAILED DESCRIPTION

Figure 1:
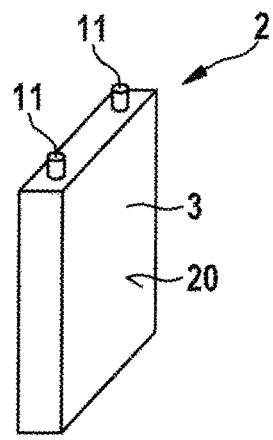
FIG. 1 shows a schematic perspective representation of a battery cell according to a first illustrative embodiment.

A battery system 1 comprises a plurality, presently fourteen, of battery cells 2. The battery cells 2 are prismatic and oriented parallel to one another in the form of a battery cell stack.

The battery cells 2 of the battery system 1 are disposed on a support plate 4. Two lateral sections 10 disposed at a distance to one another laterally surround the battery cells 2. The support plate 4 and the lateral sections 10 are part of a housing in which the battery system 1 is disposed.

Each of the battery cells 2 comprises two terminals 11 via which a voltage provided by the battery cell 2 may be tapped. Further, the battery cell 2 may also be charged via the terminals 11. The battery cell 2 further comprises a cell housing 3 which is prismatic, i.e. cuboid shaped.

Provided in the cell housing 3 of the battery cell 2 is an electrode unit which comprises two electrodes, namely an anode and a cathode, and is not shown here. The electrodes are electrically connected to the terminals 11 of the battery cell 2. It is also conceivable for the battery cell 2 to comprise a plurality of electrode units electrically connected in parallel or in series. Also provided in the cell housing 3 is an electrolyte.

Figure 2:
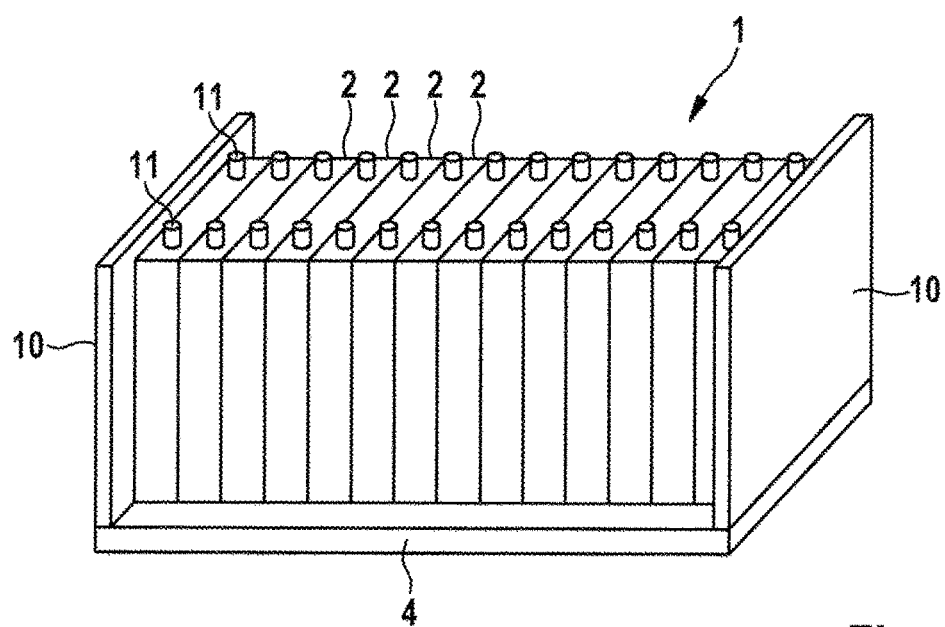
FIG. 2 shows a schematic perspective representation of a battery system according to the first illustrative embodiment.

In accordance with a first illustrative embodiment—shown in FIG. 1 and FIG. 2—each individual battery cell 2 is surrounded by its own encasement 20. The encasement 20, elaborated on in more detail below, shields electromagnetic radiation.

Figure 3:
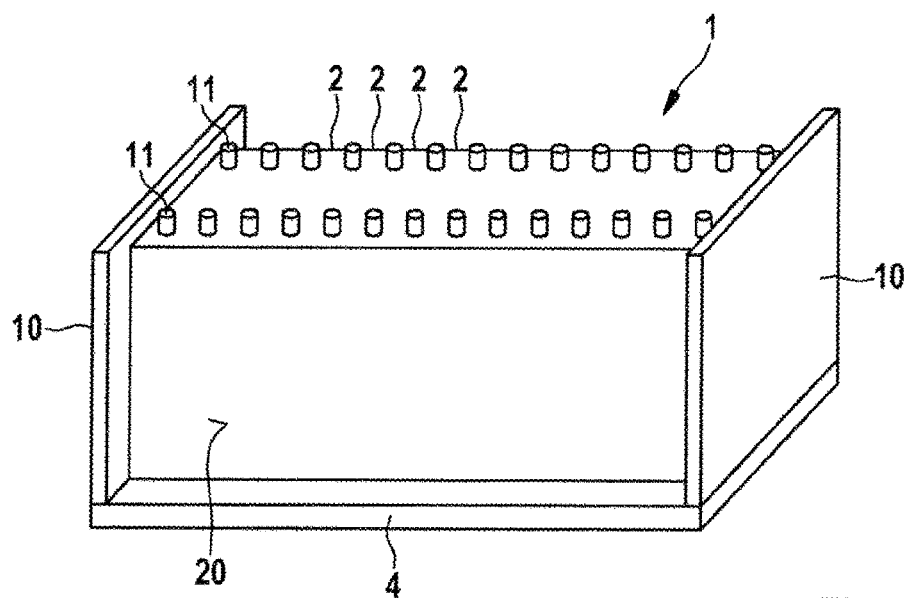
FIG. 3 shows a schematic perspective representation of a battery system according to a second illustrative embodiment.

In accordance with a second illustrative embodiment shown in FIG. 3, the battery system 1 is surrounded by one encasement 20. This means that all battery cells 2 of the battery system 1 are surrounded by a common encasement 20.

Figure 4:
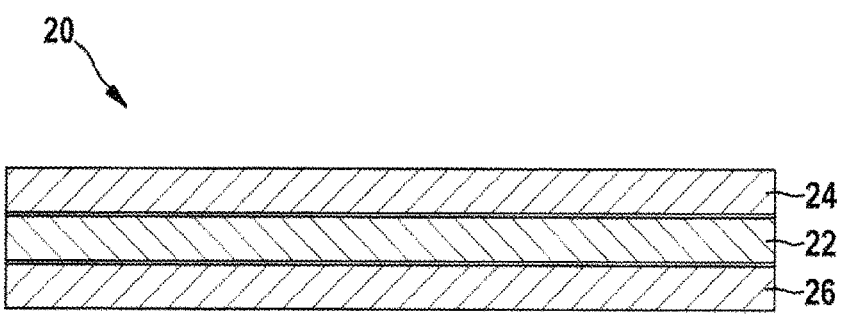
FIG. 4 shows a schematic cross-section through an encasement.

The encasement 20 is in the form of a relatively thin sheet and comprises a core layer 22 surrounded by a first covering layer 24 and a second covering layer 26 as shown, not to scale, in FIG. 4. The encasement 20 is thus in the form of a sandwich having a central core layer 22 and two covering layers 24, 26 enclosing the core layer 22 between them. In the present case each of the covering layers 24, 26 is a polymer sheet.

The first covering layer 24 and/or the second covering layer 26 may also be omitted. In this case the encasement 20 consists merely of the core layer 22.

The core layer 22 of the encasement 20 comprises an oxide material and carbon nanotubes. These are also known as CNT. The core layer 22 comprises the oxide material and the carbon nanotubes in a ratio of from 1:1 to 5:1, in the present case of about 3:1.

The oxide material employed may be, for example, titanium dioxide, silicon oxide, silicon dioxide or aluminum oxide. The oxide material employed may also be a mixture of two or more of these or other oxides. Using a mixture of two or more oxides makes it possible to reduce the temperature of deposition of the oxides on a flexible polymer substrate.

Producing the encasement 20 comprises initially generating the core layer 22. The covering layers 24, 26 are applied to the core layer 22 subsequently.

Producing the core layer 22 comprises initially generating an oxide layer. Carbon nanotubes are added to this oxide layer subsequently.

Generating the oxide layer comprises initially coating a polymer substrate, for example polysulfone or polyimide or polyester, with a solution of an oxide material, in particular an aluminum or titanium precursor, for example aluminum butoxide or titanium isopropoxide, in alcohol.

Coating is accomplished, for example, by immersion, spraying or by screen printing.

Suitable materials for an oxide layer produced by screen printing also include nanomaterials made of aluminum oxide, titanium dioxide, silicon oxide or silicon dioxide and also mixtures of at least two of these oxides. Such a mixture preferably has a weight ratio of from 0.1:10 to 1:10 or 1:1 or 1:5.

Once coating has been accomplished the coated polymer substrate is heated to a temperature between 100° and 200° in a vacuum chamber. The vacuum chamber permits heating of the polymer substrate to such temperatures.

This heating forms an adherent oxide layer on the polymer substrate. The low-temperature sintering thus forms an oxide layer of from about 1 micrometer to 10 micrometers in thickness.

Once the adherent oxide layer has been formed carbon nanotubes are applied to this oxide layer.

To this end the carbon nanotubes are first dispersed in an organic solution, preferably an alcohol solution, by high-shear mixing. Alkali metals such as potassium or sodium for example may be added to the alcohol solution to aid dispersal.

The thus formed highly-dispersed solution comprising the carbon nanotubes is applied to the abovedescribed oxide layer. To this end, for example, the highly-dispersed solution is sprayed onto the oxide layer or the oxide layer is immersed in the highly-dispersed solution. The thus treated oxide layer is subsequently dried, preferably air dried. A plurality of such spraying operations or immersing operations with subsequent drying may be carried out until the desired amount of carbon nanotubes is present on the oxide layer.

The abovedescribed application of the carbon nanotubes to the oxide layer forms the core layer 22 of the encasement 20.

A polymer sheet is subsequently applied to one side of the thus formed core layer 22 as first covering layer 24. A further polymer sheet is applied to the opposite side of the core layer 22 as second covering layer 26. This forms the encasement 20 in the form of a thin, flexible sheet.

The encasement 20 thus formed may, for example, be applied to the cell housing 3 of the battery cell 2 according to the first illustrative embodiment, thus encasing the single battery cell 2.

The encasement 20 formed may, for example, also be applied to the adjacent cell housings 3 of the battery cells 2 of a battery system 1 according to the second illustrative embodiment, thus encasing all battery cells 2 of the battery system 1.

Using an electrically nonconducting polymer substrate in the production of the oxide layer of the core layer 22 has the effect that the encasement 20 too is electrically nonconducting.

The encasement 20 thus not only shields electromagnetic radiation but also protects the surface of the cell housing 3 of the battery cell 2 by providing necessary insulation.

The invention is not restricted to the illustrative embodiments described here and the aspects highlighted therein. Rather, within the scope of the claims, numerous modifications within the capabilities of those skilled in the art are possible.

What is claimed is:

1. A battery cell (2) comprising a cell housing (3) and at least one encasement (20) surrounding the cell housing (3), the encasement being in the form of a sheet comprising a core layer (22) and at least one covering layer (24, 26) applied to the core layer (22), wherein the core layer (22) comprises carbon nanotubes, and wherein the at least one covering layer (24, 26) does not include carbon nanotubes.

2. The battery cell (2) according to claim 1, characterized in that the core layer (22) comprises an oxide material.

3. The battery cell (2) according to claim 2, wherein the core layer (22) comprises the oxide material and the carbon nanotubes in a ratio from 1:1 to 5:1.

4. The battery cell (2) according to claim 1, characterized in that the core layer (22) comprises a polymer substrate.

5. The battery cell (2) according to claim 1, characterized in that the at least one covering layer (24, 26) is a polymer sheet.

6. The battery cell (2) according to claim 1, wherein the at least one covering layer (24) is applied to one side of the core layer (22) and a second covering layer (26) is applied to an opposite side of the core layer (22).

7. The battery cell (2) according to claim 6, wherein the at least one covering layer (24) is a polymer sheet.

8. The battery cell (2) according to claim 7, wherein the second covering layer (26) is a polymer sheet.

9. The battery cell (2) according to claim 1, wherein the cell housing (3) includes at least two electrodes electrically connected to the battery cell (2).

10. The battery cell (2) according to claim 1, wherein the cell housing (3) is cuboid shaped.

11. A process for producing an encasement (20) for a battery cell (2) according to claim 1, the process comprising initially coating a polymer substrate with an oxide material and applying carbon nanotubes to an oxide layer thus formed.

12. The process according to claim 11, further comprising heating the oxide material-coated polymer substrate before application of the carbon nanotubes.

13. The process according to claim 11, further comprising dispersing the carbon nanotubes in a solution before application to the oxide layer and applying the solution comprising the carbon nanotubes to the oxide layer.

14. The process according to claim 11, further comprising forming the oxide layer to a thickness of 1 micrometer to 10 micrometers.

* * * * *